(12) United States Patent
Honer et al.

(10) Patent No.: US 7,763,983 B2
(45) Date of Patent: Jul. 27, 2010

(54) STACKABLE MICROELECTRONIC DEVICE CARRIERS, STACKED DEVICE CARRIERS AND METHODS OF MAKING THE SAME

(75) Inventors: Kenneth Allen Honer, Santa Clara, CA (US); Jae M. Park, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 279 days.

(21) Appl. No.: 11/825,121

(22) Filed: Jul. 2, 2007

(65) Prior Publication Data

US 2009/0008795 A1 Jan. 8, 2009

(51) Int. Cl.
*H01L 23/48* (2006.01)
*H01L 23/52* (2006.01)

(52) U.S. Cl. .............. 257/778; 257/686; 257/787; 257/692; 257/E23.169

(58) Field of Classification Search ............. 257/778, 257/686, 702, 787, E23.169, 692
See application file for complete search history.

(56) References Cited

U.S. PATENT DOCUMENTS

| | | | |
|---|---|---|---|
| 4,551,746 A | 11/1985 | Gilbert et al. | |
| 4,638,348 A | 1/1987 | Brown et al. | |
| 4,868,712 A | 9/1989 | Woodman | |
| 4,894,706 A * | 1/1990 | Sato et al. | 361/770 |
| 4,956,694 A * | 9/1990 | Eide | 257/686 |
| 4,996,583 A | 2/1991 | Hatada et al. | |
| 4,996,587 A | 2/1991 | Hinrichsmeyer et al. | |
| 5,028,986 A | 7/1991 | Sugano et al. | |
| 5,172,303 A | 12/1992 | Bernardoni et al. | |
| 5,222,014 A | 6/1993 | Lin | |
| 5,247,423 A | 9/1993 | Lin et al. | |
| 5,281,852 A | 1/1994 | Normington | |
| 5,311,401 A | 5/1994 | Gates, Jr. et al. | |
| 5,313,096 A | 5/1994 | Eide | |
| 5,455,740 A | 10/1995 | Burns | |
| 5,600,541 A | 2/1997 | Bone et al. | |
| 5,608,265 A | 3/1997 | Kitano et al. | |
| 5,637,536 A | 6/1997 | Val et al. | |
| 5,783,870 A | 7/1998 | Mostafazadeh et al. | |
| 5,801,439 A | 9/1998 | Fujisawa et al. | |
| 5,835,988 A | 11/1998 | Ishii et al. | |
| 5,888,884 A * | 3/1999 | Wojnarowski | 438/462 |
| 6,072,233 A | 6/2000 | Corisis et al. | |
| 6,195,268 B1 | 2/2001 | Eide | |

(Continued)

FOREIGN PATENT DOCUMENTS

JP 60194548 10/1985

(Continued)

*Primary Examiner*—Nitin Parekh
(74) *Attorney, Agent, or Firm*—Lerner, David, Littenberg, Krumholz & Mentlik, LLP

(57) ABSTRACT

A method of manufacturing a microelectronic package. The method includes the steps of attaching at least one microelectronic element to a tape having upper terminals projecting upwardly from an upper surface of a dielectric layer, so that top surfaces of the terminals are disposed coplanar with or above a top surface of the microelectronic element after the attaching step, electrically connecting the microelectronic element to at least some of the upper terminals; and further includes the step of applying an encapsulant to cover at least a portion of the upper surface of the dielectric layer, leaving the upper terminals surfaces of the terminals exposed.

9 Claims, 10 Drawing Sheets

U.S. PATENT DOCUMENTS

| | | |
|---|---|---|
| 6,303,997 B1 | 10/2001 | Lee et al. |
| 6,369,445 B1 | 4/2002 | Khoury |
| 6,441,475 B2 * | 8/2002 | Zandman et al. ............ 257/685 |
| 6,894,386 B2 * | 5/2005 | Poo et al. .................... 257/730 |
| 7,253,527 B2 * | 8/2007 | Tanida et al. ................ 257/774 |
| 7,378,748 B2 * | 5/2008 | Shimizu et al. ............. 257/787 |
| 2004/0031972 A1 | 2/2004 | Pflughaupt et al. |

FOREIGN PATENT DOCUMENTS

| | | |
|---|---|---|
| WO | 03019654 | 3/2003 |

* cited by examiner

STACKABLE MICROELECTRONIC DEVICE CARRIERS, STACKED DEVICE CARRIERS AND METHODS OF MAKING THE SAME

BACKGROUND OF THE INVENTION

The present invention relates to stacked microelectronic assemblies, to methods of forming such assemblies, and stackable microelectronic packages useful in such stacked assemblies.

Microelectronic devices, such as semiconductor chips, piezoelectric elements and micromechanic systems, etc., are typically are thin and flat, with relatively large front and rear surfaces and small edge surfaces. The devices have contacts on their front or rear surfaces. Typically, microelectronic devices are provided as packaged devices having terminals suitable for connection to an external circuit. Packaged devices, such as chips, typically are also in the form of flat bodies. Ordinarily, the packaged chips are arranged in an array on a surface of a circuit board. The circuit board has electrical conductors, normally referred to as "traces" extending in horizontal directions parallel to the surface of the circuit board and also has contact pads or other electrically conductive elements connected to the traces. The packaged chips are mounted with their terminal-bearing faces confronting the surface of the circuit board and the terminals on each packaged chip are electrically connected to the contact pads of the circuit board.

The conventional packages for microelectronic devices, such as chips, typically have a surface area that is larger than the area of the chip, causing the wiring board of interconnection to have excessively large area relative to the chips. However, as the operational speed of the device increases, it is desirable to move the chips close together since long signal paths deteriorates signal consistency and propagation times, and causes more electromagnetic noise. Other characteristics of the chip package such as manufacturing cost, reliability, heat transfer, moisture resistance and testability are also significant.

These considerations for microelectronic device packages have been addressed by the design of high-density packages, such as ball grid arrays (BGA) and chip scale packages (CSP). Although these packages provide certain advantages, further enhancement would be desirable.

Multi-chip modules (MCM) that package multiple chips on a common wiring board or substrate are an alternative for high-density packaging. These modules aim to achieve higher packaging density, and can also produce better signal quality, and reasonable manufacturing cost. Many MCMs are two-dimensional structures with multiple chips connected to a planar interconnection substrate which contains traces to supply power and signal transmission. However, since multi-chip modules utilize a planar interconnection substrate as a base element, their effectiveness in packaging density is limited.

In order to create higher density packages, reduce area requirements and shorten signal transmission distances, stackable device packages with two, three or more vertically stacked chips have been proposed. Stackable packages are particularly suitable for the electronic systems such as high performance parallel computing and large cache memory devices which require high operating speeds and high memory capacity in a limited space.

Examples of stacked packages are shown, for example, in U.S. Pat. Nos. 4,956,694; 5,198,888; 5,861,666; 6,072,233; and 6,268,649. The stacked packages shown in certain embodiments of these patents are made by providing individual units, each including a single chip and a package element having unit terminals. Within each unit, the contacts of the chip are connected to the unit terminals. The units are stacked one atop the other. Unit terminals of each unit are connected to the corresponding unit terminals of other units. The connected unit terminals form vertical conductors of the stacked package, also referred to as buses.

Despite all the advancements in technology for stacked microelectronic packages, still further improvements would be desirable. For example, it would also be desirable to provide a compact stacked package using readily-available equipment and using components that can be fabricated readily and with low cost. Furthermore, it would also be desirable to provide a stacked package with good heat transfer from the chips within the stack to the external environment as, for example, to the circuit board or to a heat spreader overlying the top of the package. Further, it would be desirable to provide such a package.

SUMMARY OF THE INVENTION

According to a first aspect of the present invention, a method of manufacturing a microelectronic package is provided. Preferably, the method of manufacturing the package includes a step of attaching at least one microelectronic element to a tape having upper terminals projecting upwardly from an upper surface of a dielectric layer so that top surfaces of the terminals are disposed coplanar with or above a top surface of the microelectronic element after the attaching step. An additional step of electrically connecting the microelectronic element to at least some of the upper terminals is provided. In addition, the method preferably includes a step of applying an encapsulant to cover at least a portion of the upper surface of the dielectric layer, leaving the upper terminals surfaces of the terminals exposed.

According to another aspect of the present invention, a stackable microelectronic device package is manufactured by the above method. It is preferable that the device includes a dielectric layer having upper and lower surfaces. In addition, the device preferably includes a microelectronic element disposed above the upper surface of the dielectric layer, and an encapsulant overlying the upper surface of the dielectric layer, the encapsulant having a top surface remote from the dielectric layer and having edge surfaces, the encapsulant also having edge surfaces. It is further desirable that the device includes electrically conductive terminal bodies embedded in the encapsulant, the terminal bodies defining upper terminals exposed at the top surface of the dielectric layer and lower terminals exposed at the lower surface of the dielectric layer the terminal bodies also being exposed at the edge surfaces of the encapsulant layer, at least some of the terminal bodies being electrically connected to the microelectronic element.

BRIEF DESCRIPTION OF THE DRAWINGS

These and other features, aspects and advantages of the present invention will become better understood with regard to the following description, appended claims and accompanying drawings where:

It should be noted that the dimensions of the assemblies shown in the Figures may be distorted for clarity of illustration, and like numbers represent similar elements.

DETAILED DESCRIPTION

Figure 1:
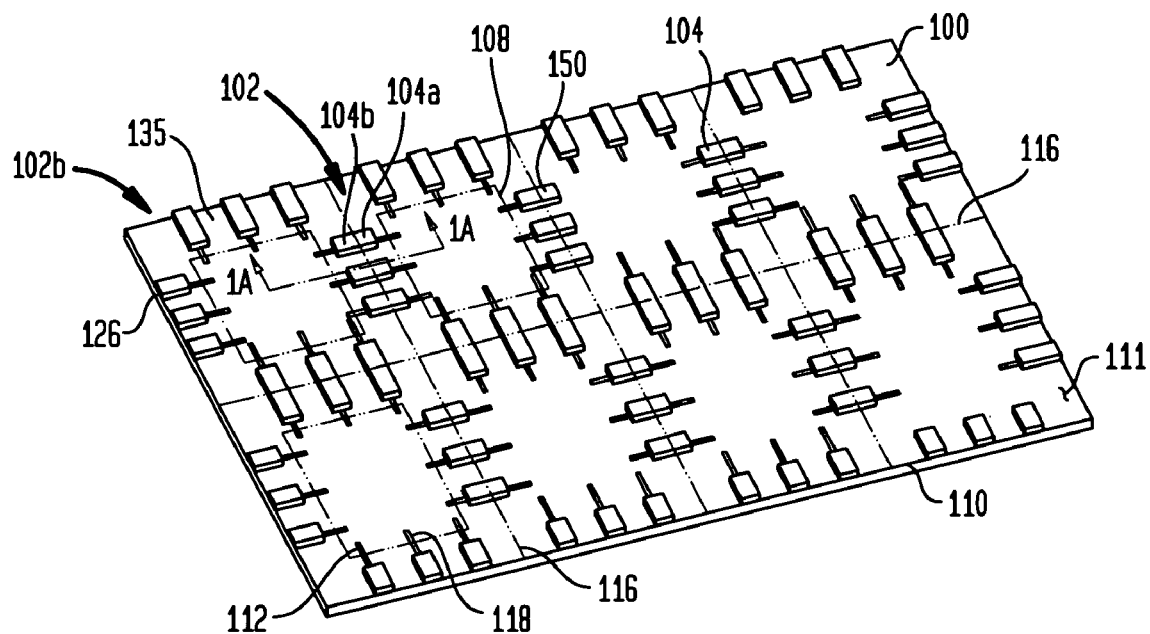
FIG. 1 is a diagrammatic top perspective view depicting a tape used in a method in accordance with a first embodiment of the present invention.

A method according to a first embodiment of the present invention uses a large sheet or tape 100 (FIG. 1). Tape 100 includes one or more continuous dielectric layers 110, and has numerous individual regions 102, each of which will form one chip carrier. The sheet or tape 100 may be provided with conventional registration features such as sprocket holes (not shown) for transportation and positioning of the tape. Although the borders 116 of the individual chip carriers or regions 102 are delineated in FIG. 1 for clarity of illustration, it should be appreciated that at this stage there may be no physical demarcation between adjacent chip carriers or regions 102.

The dielectric layer 110 of the sheet or tape 100 has an upper surface 111 and a lower surface 113 facing downwardly. As used in this disclosure, terms such as "upwardly," "upper," "top," "downwardly," "lower," "bottom," "vertically," and "horizontally" should be understood as referring to the frame of reference of the element specified and need not conform to the normal gravitational frame of reference. Dielectric layer 100 may be formed from any dielectric material suitable for use in semiconductor packaging, but most preferably is formed from a polymeric material such as a material selected from the group consisting of polyimide, BT resin, liquid crystal polymer and combinations thereof, with or without reinforcing agents such as fibrous reinforcements. The dielectric layer may be of any thickness, but most typically is about 25-100 microns thick.

Figure 1A:
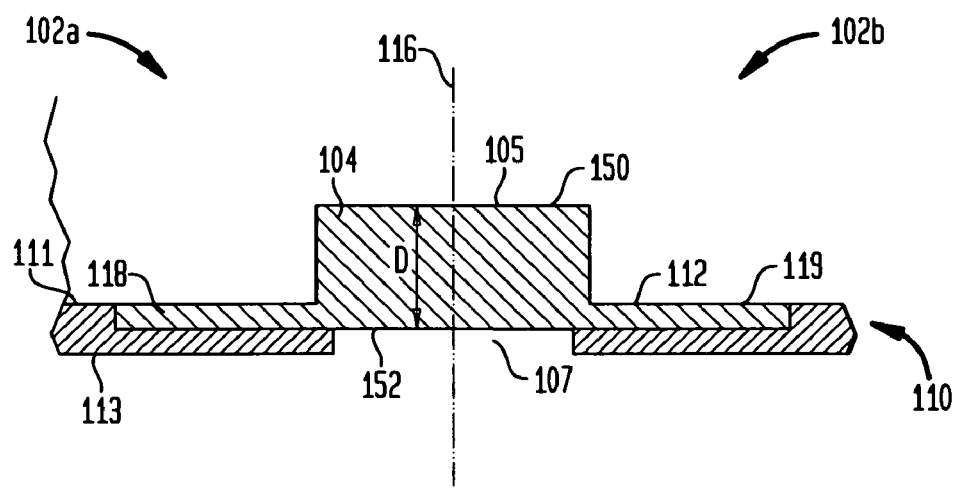
FIG. 1a is a sectional view along line 1A-1A in FIG. 1.

The tape has solid, metallic, electrically conductive terminal bodies 104 arranged in rows along the boundaries 116 between adjacent regions, with spaces 135 between adjacent terminals in each row. As best seen in FIG. 1A, each terminal body which lies at a boundary 116 extends across the boundary, so that a portion of the terminal body is disposed in one region 102a and another portion of the same terminal body is disposed in the neighboring region 102b. As also seen in FIG. 1A, defines an upper terminal 150 projecting upwardly from upper surface 111, the upper terminal having a substantially flat, upwardly-facing surface. Merely by way of example, the surfaces of upper terminals 150 may project upwardly from upper surface 111 of the dielectric layer by a projection distance p of about 100-500 microns. Each terminal body 104 also defines a lower terminal 152 accessible through the dielectric layer 110, the lower terminal having a flat surface that extends into the dielectric layer 110 with the lower surfaces of conductive traces 112. The lower terminal 152 is accessible through an opening 107 of the dielectric layer. In this embodiment, the terminal bodies 104 are of substantially uniform height D, i.e., all of the terminal bodies have substantially the same height from the lower terminal 152 to the top terminal 150. As further discussed below, the terminal bodies 104 may be formed from a common metallic sheet or plate, which helps to provide terminal bodies of uniform height.

Electrically conductive traces 112 extend from the terminal bodies 104. In the particular embodiment illustrated, the traces are formed integrally with the terminal bodies and are embedded into the dielectric layer 110. The upper surface of the traces 112 is flush with the upper surface 111 of the dielectric layer. The traces and terminals most typically are formed from copper, copper alloys, gold, silver, tin, nickel, or combinations of these materials. In a variant, traces 112 may be arranged on upper surface 111 of the dielectric layer 110. In the embodiment shown in FIG. 1, each trace 112 has a connection pad 118 which constitutes an end portion of a trace 112 remote from the terminal 104. The connection pads 118 optionally can be of larger width than the traces. 112. The connection pads 118 of each unit are placed at positions where the contacts of a microelectronic device will be located, that has to be packaged. The outline of the device area 108 is also delineated in FIG. 1, showing the place where a microelectronic device will be positioned and attached to the individual chip carriers 102. Outline 108 is shown for clarity of illustration. However, there may be no physical demarcation of the placement of the chip on the real chip carriers 102. A solder mask layer (not shown) may cover the upper surface of the chip carrier, except for the upper terminals 150, and the connection pads 118 of the traces 112.

Figure 2:
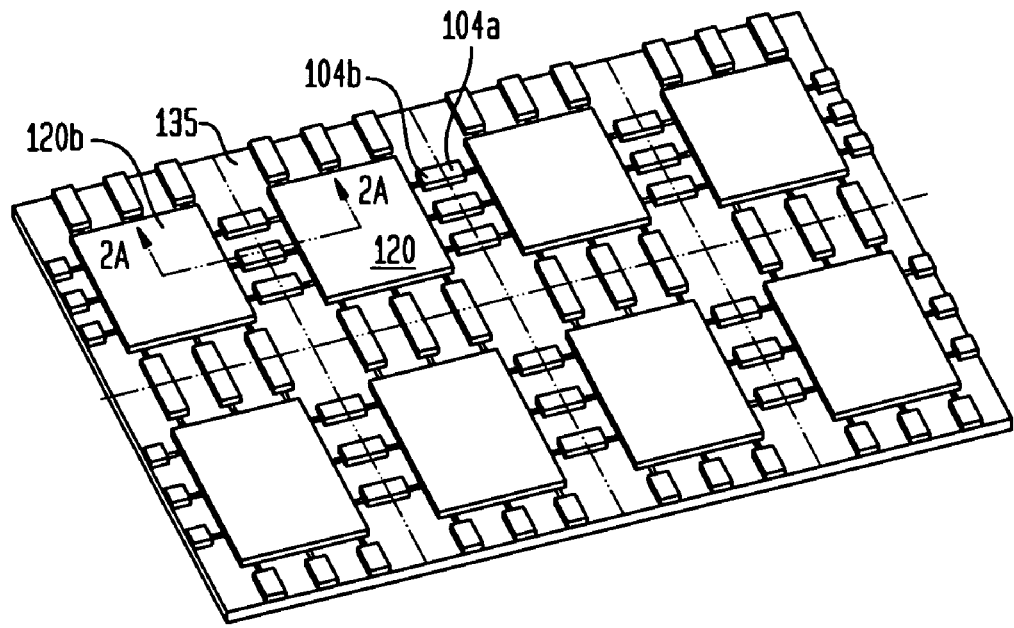
FIG. 2 is a diagrammatic top perspective view depicting the tape of FIG. 1 at a later stage of the method.
Figure 2A:
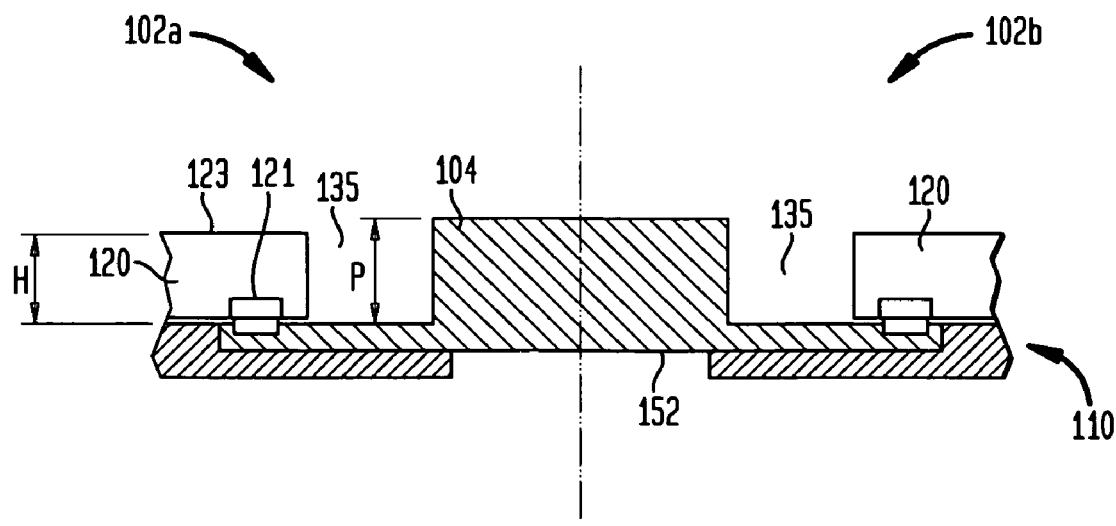
FIG. 2a is a sectional view along line 2A-2A in FIG. 2.

In a step of the method, as shown in FIGS. 2 and 2A, microelectronic elements 120 such as semiconductor chips are assembled to the various regions 102, while leaving the regions 102 attached to each other in the sheet or tape 100. Microelectronic elements 120 may be semiconductor chips such as, for example, memory chips such as DRAM, MRAM, flash memory or the like, or other semiconductor chips such as processors. In other embodiments, the microelectronic elements may be devices other than semiconductor chips as, for example, chip-like devices containing only passive electronic elements, commonly referred to as "integrated passives on chip" or "IPOC" elements.

Each microelectronic element 120 is placed onto the device area 108 (FIG. 1). The contacts 121 (FIG. 2A) of each microelectronic element 120 are connected to the connection pads 118 of the traces 112. The microelectronic elements shown in FIGS. 2 and 2A are flip chip bonded. The chip can be electrically connected to the connection pads 118 by first either applying a solder on the connection pads 118 or on the contacts 121 of the microelectronic device 120, and then reflowing the solder, once the microelectronic element is brought into position. Other connection techniques may be employed, as, for example, eutectic bonding or diffusion bonding. Also, the contacts 121, the connection pads 118 or both may be provided with projecting bumps formed from suitable bonding metals, and such bumps may be used to form the bonds. Before attaching the microelectronic elements 120 to the tape 100, an adhesive or other filler material (not shown) optionally can be placed either on the bottom surface of the microelectronic elements 120, or on the upper surface 111 of the dielectric layer 110, so that the filler material is positioned between the microelectronic elements and the upper surface of the tape. For example, the filler may include a thermoconductive paste to improve the thermal conductivity of the device 120 to the chip carrier 102.

The microelectronic elements 120 can be placed onto tape 100 and positioned using techniques as commonly employed in flip chip bonding. For example, a machine vision system for checking the position of the microelectronic element 120 and comparing this position of the position of the traces 112 or the location of the terminal bodies 104 could be used. In a variant, the dimensions between the terminal bodies 104 of each region 102 are selected so as to form a close fit with the microelectronic element 120 between them. In such case, the outline of the microelectronic element abuts the terminal bodies 104 and the terminal bodies guide the microelectronic element to a position where the contacts 121 are aligned with the connection pads 118. As further seen in FIG. 2A, the microelectronic elements 120 have rear surfaces 123 facing upwardly, away from the dielectric layer. The height H from the upper surface of the dielectric layer to the rear surfaces of the microelectronic elements in this embodiment is slightly less than the upward projection distance P of the terminal bodies 104.

In the next step of the method, an encapsulant 138 is deposited over the upper surface 111 of the dielectric layer 110. As best seen in FIG. 3A, the tape 100 may be placed between an upper mold element 160 and a lower mold element 162, so that each terminal body 104 is forcibly engaged by the mold elements, with the upper mold element 160 bearing on the upper terminal surface 150 and with the lower mold element 162 bearing on the lower terminal surface 152. The encapsulant is then injected between the mold elements, and flows over the upper surface 111 of the dielectric element 110. The encapsulant flows around the microelectronic elements 120 and flows between the terminal bodies as, for example, through the spaces 135 between the terminal bodies of each row. In the embodiment shown, the encapsulant flows over the rear surfaces 123 of the microelectronic element. After the encapsulant is injected, it is brought to a solid condition. The encapsulant may be a dielectric material such as an epoxy which solidifies by chemical reaction, with or without application of heat, or a thermoplastic material which solidifies upon cooling.

The encapsulant 138 forms a solid layer which covers the microelectronic elements 120 and the upper surface 111 of the dielectric layer 110, but which does not cover the upper terminals 150. Also, the encapsulant does not cover the lower terminals 152, the opening 107, or the lower surface 113 of the dielectric layer. The encapsulant layer has a top surface flush with the upper terminals 150.

In a variant of this step, the encapsulant may be applied by dispensing the encapsulant in a flowable state onto the upper surface of the dielectric layer without using a mold and distributing the encapsulant over the surface so that the encapsulant forms a layer of the required thickness. For example, the encapsulant 138 is dispensed over the sheet 100, without using a mold, while the sheet is held in a horizontal position, so that the encapsulant 138 will evenly spread out on the upper surface 111 of the dielectric layer and will fill the spaces 135 between the terminal bodies. The tape 100 should be held in such a position until the encapsulant is hardened. A process commonly referred to as spin-coating can be used to distribute the encapsulant over the top surface in a uniform layer.

In yet another variant of the present invention, the encapsulant 138 that is dispensed will cover the upper surface 111 of the dielectric layer, and will flow between the microelectronic element 120 and the dielectric layer 102, but will not cover the rear surface 123 of microelectronic element. Such step may be desirable to reduced weight of the package 102', and to minimize the quantity of encapsulant used per package 102'.

The encapsulant can be a filled or unfilled resin such as epoxies or urethanes that show good adhesion properties, solvent and chemical resistance, and ease of processing after hardening. It is also desirable that the encapsulant have good thermal conductivity. The encapsulant application process can also be performed inside a vacuum chamber, to eliminate inclusion of oxygen and other gases in the stackable chip carrier 102. In a further variant, the encapsulant application step can be performed in a heated environment since many encapsulants have a lower viscosity at higher temperature. In yet another variant, the encapsulant application step may include shearing of a thixotropic encapsulant to temporarily reduce its viscosity during the molding or dispensing step.

In yet another variant, the encapsulant application process may include application of the encapsulant in an in-process layer with a thickness or height slightly greater than the projection distance P of the terminal bodies, and then removing a portion of this in-process layer either before or after curing to leave a layer with a top surface flush with the upper terminals 152. For example, the in-process layer can be etched or polished after curing.

Figure 3:
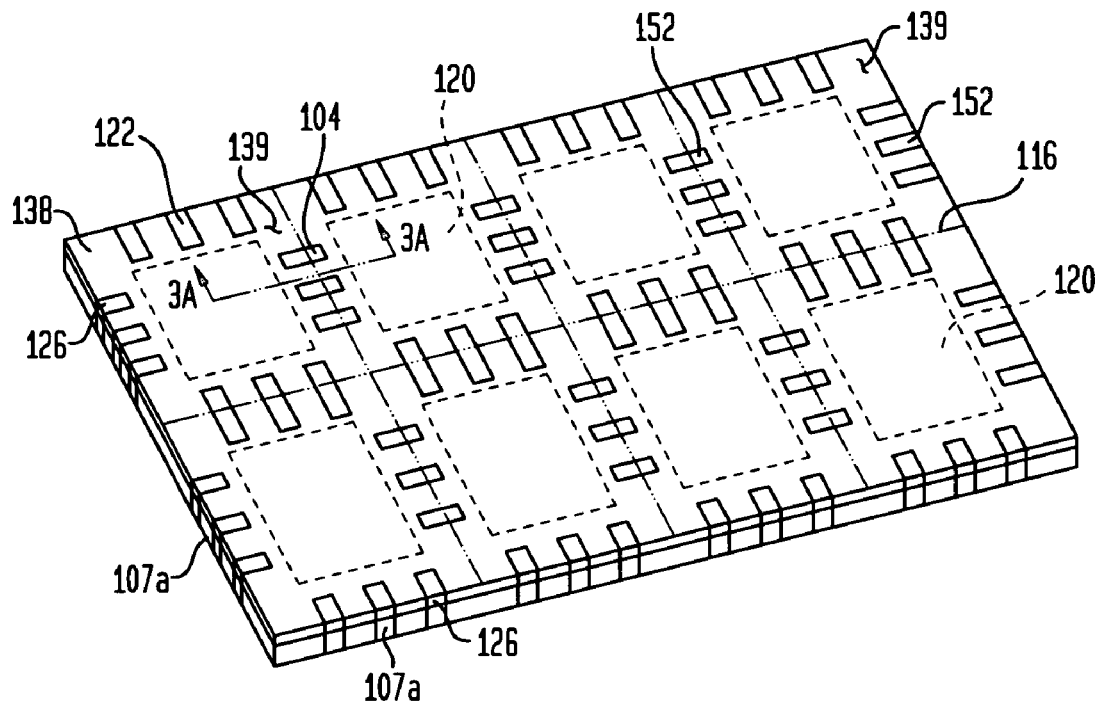
FIG. 3 is a diagrammatic top perspective view depicting the tape of FIGS. 1-2 at a later stage of the method.
Figure 3A:
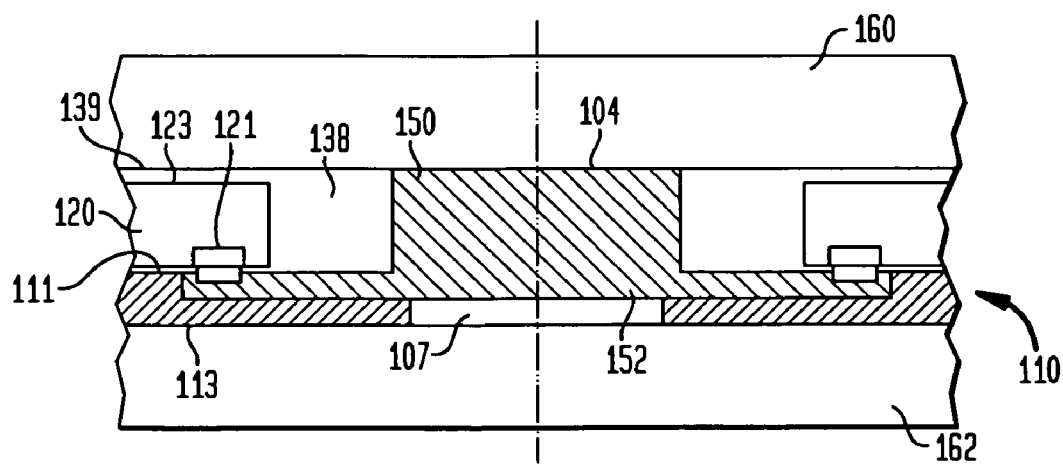
FIG. 3a is a sectional view along line 3A-3A in FIG. 3.
Figure 4:
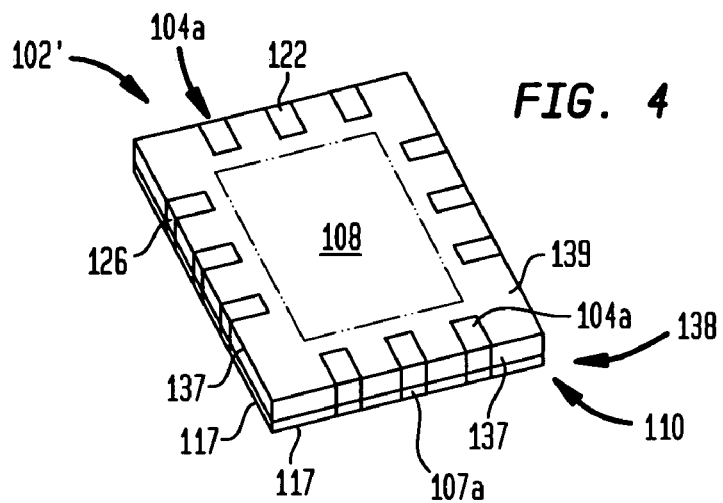
FIG. 4 is a diagrammatic top perspective view showing a chip carrier at a later stage of the method.
Figure 4A:
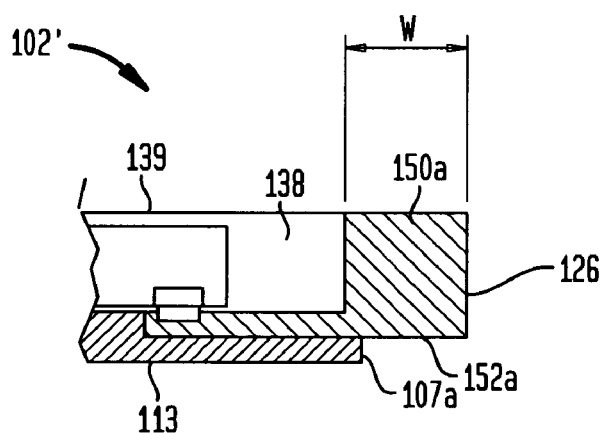
FIG. 4a is a sectional view along line 4A-4A in FIG. 4.
Figure 5:
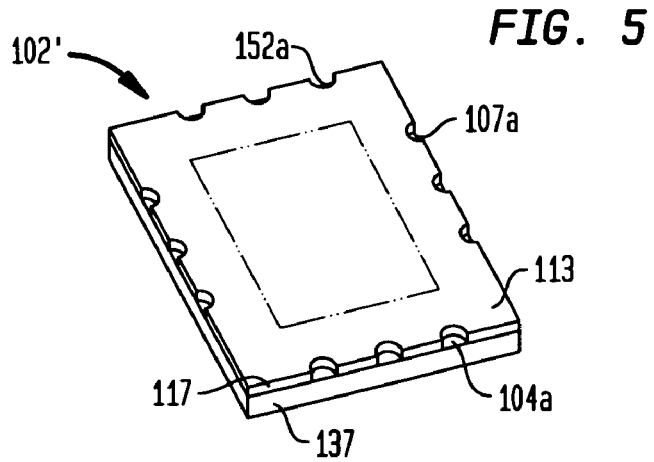
FIG. 5 is diagrammatic bottom perspective view showing a chip carrier at a later stage of the method.

After the encapsulant is applied, the tape has the configuration depicted in FIG. 3, with the top surface 139 of the encapsulant flush with the surfaces of upper terminals 152. The tape is then severed along the boundaries 116 between regions 102, by cutting through the dielectric layer 110, encapsulant layer 138 and terminal bodies 104. For example, the tape can be cut with a saw of the type commonly used for severing semiconductor chips. The severing step forms a plurality of individual units 102' (FIGS. 4, 4A and 5). Each unit 102' includes one region of the dielectric layer 110, a microelectronic element 120, and a portion of the encapsulant layer 138 overlying the dielectric layer and microelectronic element 120. As best seen in FIG. 4, the severing step forms edge surfaces 137 bounding the encapsulant layer 138 and corresponding edge surfaces 117 bounding the dielectric layer. Preferably, the edge surfaces 117 of the dielectric layer and the edge surfaces 137 of the encapsulant of corresponding sides of the package 102' are flush with each other. The severing step also cuts the terminal bodies 104 into smaller terminal bodies 104a, each of which is disposed at an edge of the unit. Each terminal body 104a defines an upper terminal 150a flush with the top surface 139 of the encapsulant layer, a lower terminal 152a embedded in the dielectric layer (FIG. 5). The severing step also separates openings 107 into the recessed openings 107a. Each terminal 104a is exposed at the edges of unit 102', i.e., at edges 117 and 137 of the dielectric layer and encapsulant layer. Each terminal body 104a has a side surface 126 flush with edges 117 and 137. The terminal bodies 104a project into the dielectric layer and encapsulant layer by a distance W (FIG. 4a). The openings 107a can be filled with a solder material so as to form solder bumps (not shown) on top of the lower terminals 152a. In a variant, a conductive epoxy may be used to fill the openings 107a.

Depending on the configuration of the original terminal bodies in the tape, this distance may be uniform or non-uniform. However, the average distance W for each terminal body desirably is at least about 10 microns, and more desirably at least about 20 microns. Thus, the terminal bodies have substantial cross-sectional areas, so that each terminal body provides a low-impedance electrical path between the upper terminal 150a and lower terminal 152a defined by that terminal body. In another variant, power terminals of the units 102' have bigger cross-sections than signal terminals.

Figure 6:
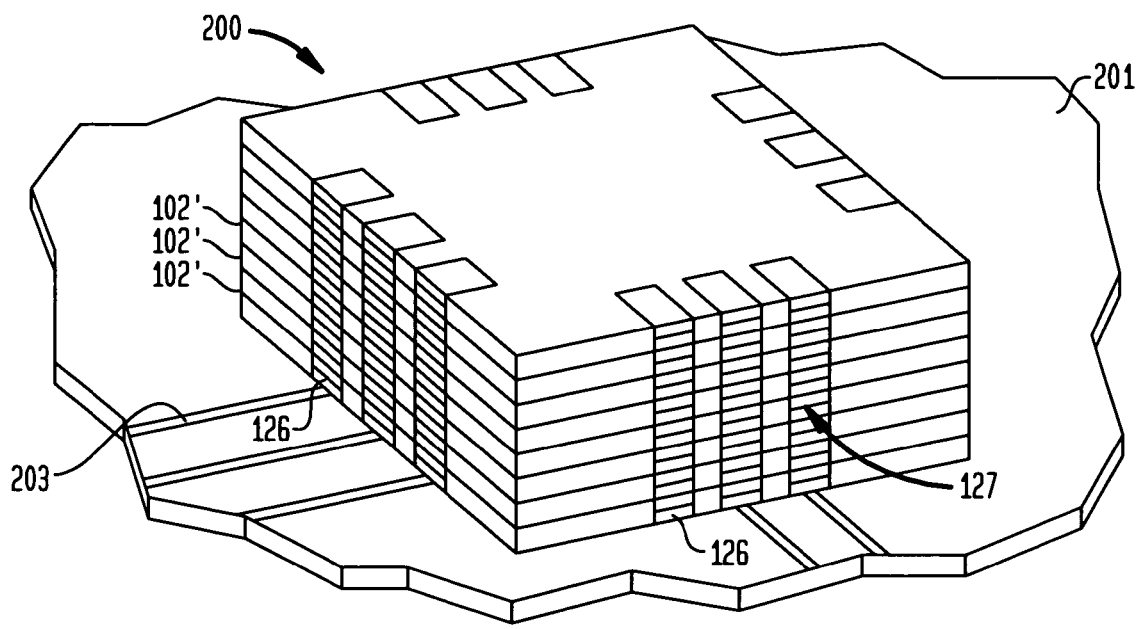
FIG. 6 is a diagrammatic top perspective view depicting the stacked chip carriers on a circuit board at a later stage of the method.

The individual units 102' formed as discussed above may be stacked on top of each other, to form a stacked microelectronic package 200, as shown in FIG. 6. In such a stack, the lower surface 113 (FIGS. 4A and 5) of the dielectric layer in each unit 102' other than the bottom unit of the stack faces toward the top surface 139 (FIGS. 4 and 4A) of the encapsulant layer of the next lower package. The lower terminals 152a of each unit other than the bottom unit in the stack are aligned with and confront the upper terminals 150a of the next lower unit in the stack. The space between two adjacent stacked packages between confronting lower terminals 152a and upper terminals 150a can be filled with solder. Since the units 102' all have substantially the same dimensions, and the edges of the units are inherently disposed in precise registration with the terminals 150a, 152a, the terminals on the stacked units can be mechanically aligned by simply aligning the edges of the individual units 102. The terminals of the stacked units can be bonded to one another by soldering them to one another to form vertically-extensive buses 127 extending through the stack. In a further alternative, the edges of the stacked packages can be exposed to a liquid solder as, for example, by contacting each edge surface of the stack with a wave of solder in a wave-soldering operation. The liquid solder can be drawn into the openings 107a between the confronting upper terminals 150a and lower terminals 152a.

The stacked package 200 can be connected to an external device, such as conductive traces 203 of a circuit board 201, for example by connecting the solder material of the lower terminals 152a of the bottom unit in the stack to an interconnection element or directly to traces 203. It is also possible to connect to the stacked package 200 at the side walls of the stack, since the side walls 126 of the terminal bodies 104a and hence buses 127 are exposed at the edges of the stack. In a further variant, a connection can be made to a device (not shown) that is located above the top chip carrier 102' of the stack 200.

It is possible that all the chip carriers 102 in the stack are soldered together in a single step, by first applying solder material into the openings 107a of the terminals 104a, stacking all the units 102' together, and then soldering the terminals. It is also possible to first stack only two units 102', then soldering them, and in a next step, stacking an additional unit 102', soldering the additional chip carrier 102, and so on. For further mechanical and thermal interconnection of the individual units 102', filler can be arranged between the upper surface 139 of the encapsulant layer each unit and the lower surface 113 of the dielectric layer 110 in the next unit. The filler can be an adhesive, or can simply be a thermal conduction paste to improve thermal conductivity between the chip carriers 102.

After the stacking of the units and forming the electrical connection between them, the outer surfaces of the stacked package 200 can be polished. For example, a small film of the side surfaces can be polished away by a mechanical polishing process by using abrasives, so that the side surfaces of the stack, including the surfaces of buses 127 exposed at the sides of the stack, are substantially co-planar and flat. Such a step can be used, for example, where the sides of the stack will be bonded to a circuit panel. In an additional step, the side surfaces 126 of the terminal bodies 104a can be plated, for example with a noble metal such as gold, silver, nickel etc.

To facilitate orientation and stacking of the units 102', each unit may be provided with features which allow the orientation of the unit to be easily identified. For example, one edge of each unit may have a being cut or slot in one edge. It is also possible to print an orientation marker onto the chip carrier. In a further variant, the severing step may be performed concomitantly with the stacking operation, so that each unit is severed from the tape in a predetermined orientation, and this orientation is retained during the stacking operation.

In the embodiment discussed above, the locations of the traces 112 and the connection pads 118, and their pattern of connection to the terminal bodies 104 (FIG. 1) are the same for all the chip carriers or regions 102. If identical units 102' are stacked and connected, all of the corresponding contacts on the microelectronic elements in all of the units will be connected in common to the same terminal bodies and hence to the same vertical buses 127 (FIG. 6). In many cases, it is desirable to have at least some interconnections between the microelectronic units 162' and the buses 127 differ from unit to unit. For example, the different units 102' included in the stack may have substantially identical routings associated with most of the terminal bodies and may have different routings associated with a few terminal bodies 104a, referred to herein as "chip select" terminal bodies. The chip select terminal bodies may be provided in sets. Each unit has one terminal body of the set of chip select terminal bodies connected to a particular connection pad, referred to herein as the "chip select connection pad," whereas the other chip select terminal bodies of the set are unconnected to any contact pads. Different ones of the units have different chip select terminal bodies connected to the chip select connection pad. Such embodiment is particularly useful in the case of memory stacks.

Units 102' with different interconnections between the microelectronic elements and buses 127 may be formed in different tapes. Alternatively, different regions of the same tape may be provided with different patterns of interconnections between the connection pads 118 (FIG. 1) and the terminal bodies 104, so that the units 102' formed from the tape will have different patterns of interconnections.

In the embodiments discussed above, terminal bodies are provided along all of the edges of the regions of the tape, and terminals are formed at all edges of the units. However, terminals may be provided along less than all of the edges, for example only on one edge of each unit, or only on two opposite sides. The invention is not limited to square or rectangular shaped or symmetrical regions 102 and units 102'. Any shape can be used as long as multiple units 102 can be cut out from the tape 100.

Figure 7:
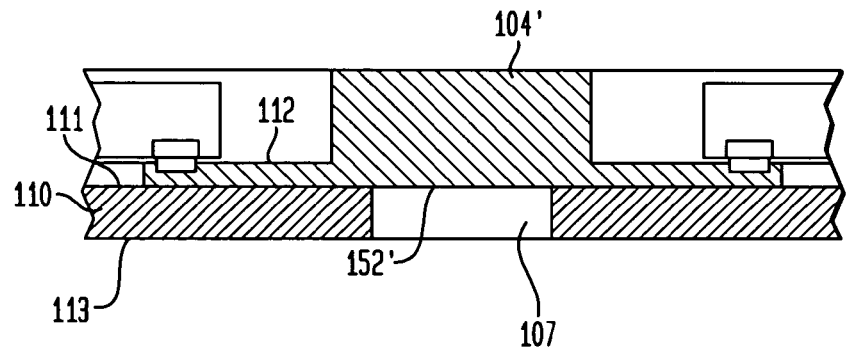
FIG. 7 is a sectional view of another embodiment of the tape of the present invention.

It is not essential to form the surfaces of the terminals flush with the surfaces of the dielectric layer and encapsulant. For example, the upper terminals 150a (FIG. 4A) may project slightly above the surface 139 or may be recessed slightly relative to the surface 139. In a molding process, the upper mold element 160 (FIG. 3A) may have recesses which receive the terminal bodies 104a, so that the top surface of the dielectric layer will lie slightly below the upper terminals 150a. In another variant shown in FIG. 7, the conductive traces 112 are formed on the upper surface of the dielectric layer 110, and the openings 107 are formed throughout the dielectric layer 110. In a further variant, the holes 107 may be omitted, so that the terminal bodies 104a only define upper terminals, and the package has no terminals exposed at the lower surface 113 of the dielectric layer. In yet another variant, the package may be provided with lower terminals defined by conductive features separate from the terminal bodies.

Figure 8A:
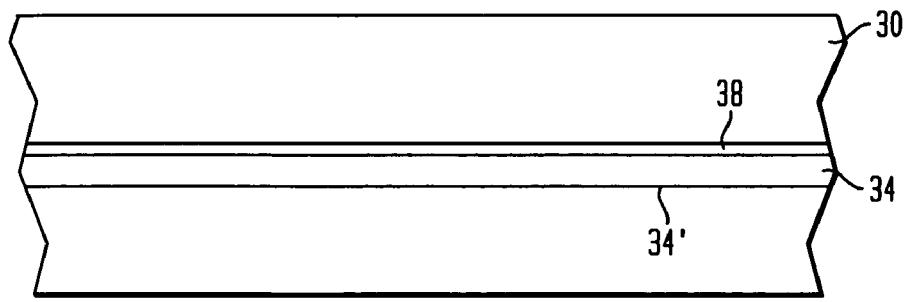
FIGS. 8a-f are sectional views of stages of a method of manufacturing the tape as shown in FIG. 1.
Figure 8B:
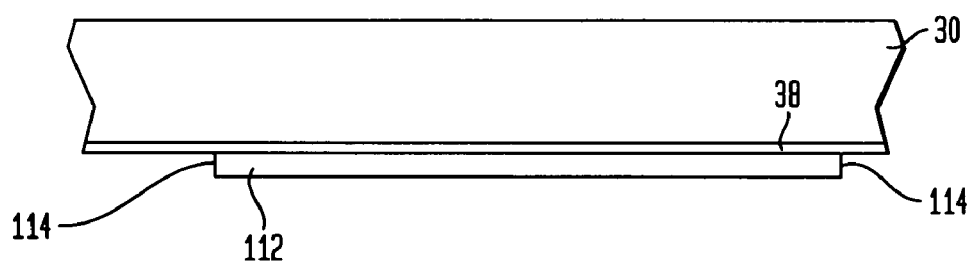
Figure 8C:
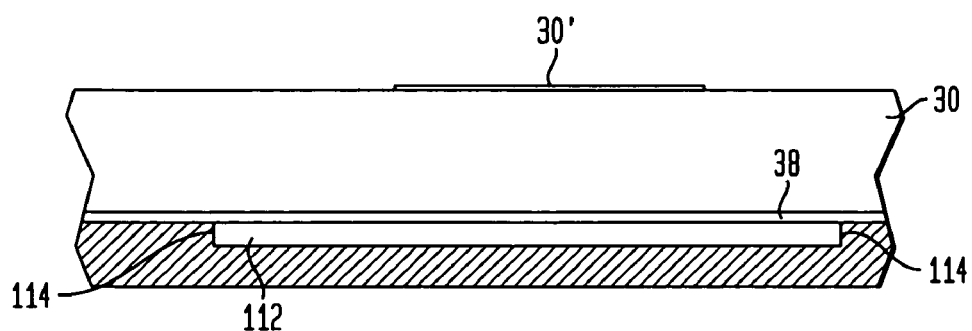
Figure 8D:
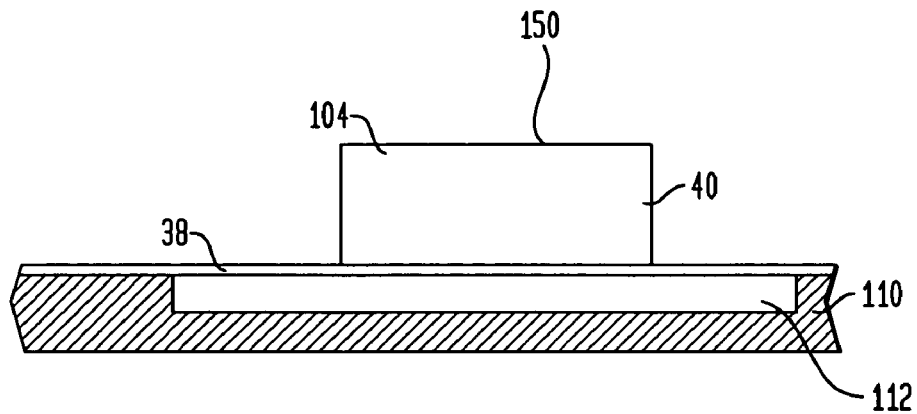
Figure 8E:
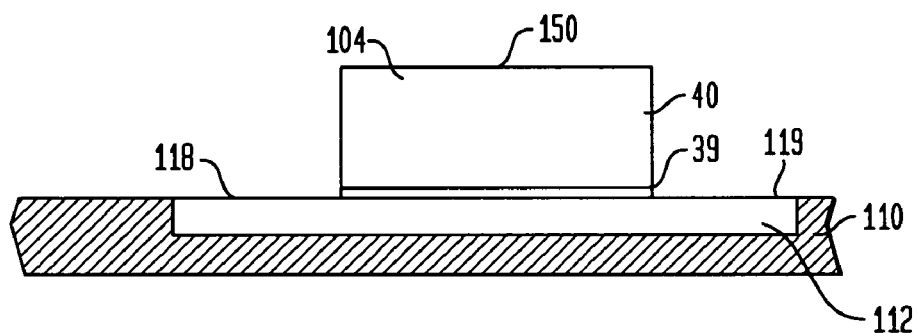
Figure 8F:
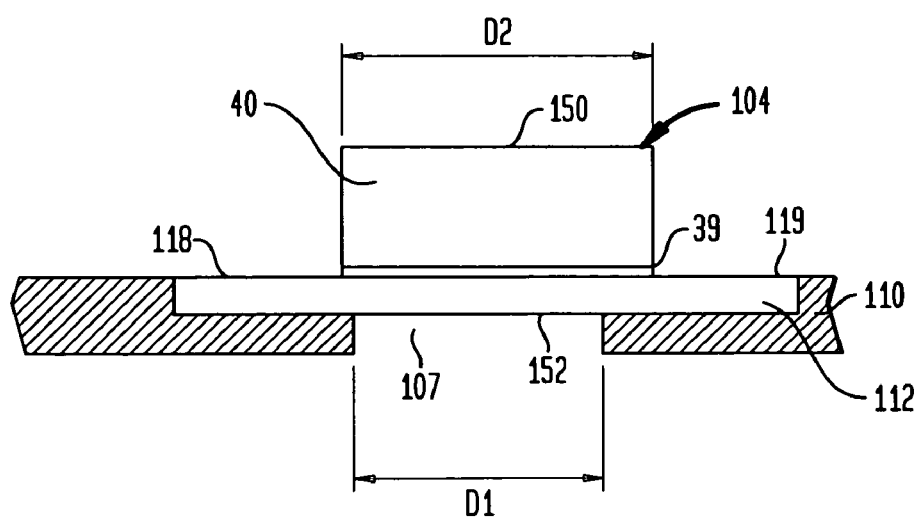

The conductive features of tape 100 (FIG. 1), including the traces 112 and terminal bodies 104, desirably are formed from a common metallic sheet. As shown in FIG. BA, a metal sheet may include a top layer 30and bottom layer 34 formed from a readily etchable metal such as copper, and very thin etch-stop layer 38 formed from a different metal, for example nickel, at the interfaces between the etchable layers 30, 34. The bottom layer is selectively masked with a mask 34' and etched (FIG. 8B) to leave traces 112 with the side walls 114 from the bottom layer 34. A copper etch that does not attack nickel may be used, for example an Ammonium etchant such as Ammonium Chloride- or Ammonium Hydroxide-based etchant. The bottom surfaces of the etch-stop layer 38, the side walls 114, and the traces 112 are then covered with a dielectric, for example by spin-coating using a flowable dielectric material such as un uncured polyimide to form the dielectric layer 110 (FIG. 8C). A mask 30' is applied to the top surface of the top layer 30, so as to etch the top layer 30 and to leave protrusion 40projecting from the etch stop layer 32 at the locations where the terminal bodies 104 are to be formed with upper terminal 150 (FIG. 8D). The etch-stop layer 38 is then removed at portions other than the portions covered by protrusion 40 (FIG. 8E). In case the etch-stop layer is a nickel layer, the removal can be done with an etchant based on Sulfuric Acid and Hydrogen Peroxide. The upper surface of the dielectric layer 110 is thereby not covered by a metallic layer, and the connection pads 118, 119 of the traces 112 are freed from the etch-stop layer 38. The dielectric layer 110 is then selectively etched from the lower surface to form holes 107, and also to free a portion from the lower surface of the traces 112 to form a lower terminal 152 of the terminal body 104 (FIG. 8F). In the variant shown, the width D1 of the hole 107 to access lower terminals 152 is narrower than the width D2 of the terminal body 104.

The foregoing process of making the tape is merely exemplary; any suitable process can be employed. For example, where the terminal bodies are to be disposed only on the top surface of the dielectric layer, the initial metal sheet may include only two etchable layers; the bottom layer 32 may be omitted.

In another embodiment of the method of manufacturing a stacked package, the step of severing the individual units from the tapes is performed after stacking. Thus, stacked packages 200 (FIG. 6) are formed by first stacking up two or more tapes 100, the respective tapes having microelectronic devices 120 attached thereto and optionally having encapsulant layers as shown in FIG. 3. Once the tapes 100 are stacked, corresponding terminals of the tapes are arranged on top of each other. The terminals are bonded to one another, for example by a reflow soldering process to fill the openings 107a to provide electrical connection between confronting upper and lower terminals. After bonding, the stacked tapes 100 are cut apart to yield numerous stacked packages, each including one unit cut from each of the tapes. Since the packages 200 are cut while already stacked, the side walls or outline of the stacked packages 200 will be substantially planar. In a further variant, the tapes are stacked and bonded before introducing the encapsulant, and the encapsulant is injected after the bonding step, and either before or after the severing step.

Figure 9:
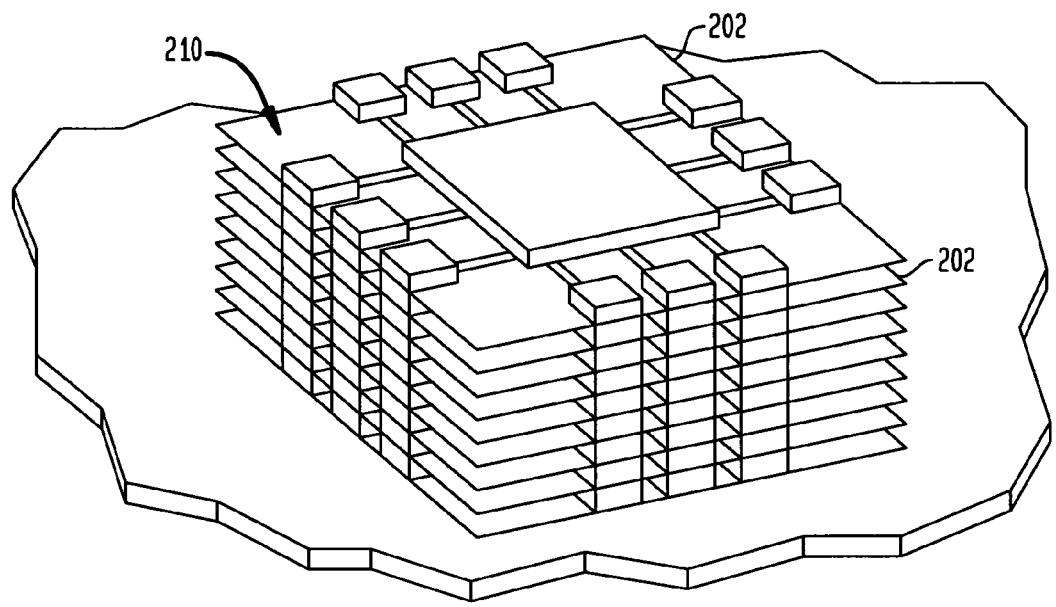
FIG. 9 is a diagrammatic top perspective view depicting the stacked chip carriers according to another embodiment of the present invention.

In yet another variant, the encapsulant is entirely omitted. In a method according to such an embodiment of the present invention, as shown in FIG. 9, a stack 210 is formed of individual units 202 similar to the individual units discussed above, but omitting the encapsulant. The stack 210 can be filled with an encapsulant after the stack 210 is formed and the terminals of the units are electrically connected together. Such a step could be performed by placing the stack 210 into a mold that encloses the stack 210 to form a container around the stack 210, with an open access for filling the encapsulant in a liquid state into the mold.

Figure 10:
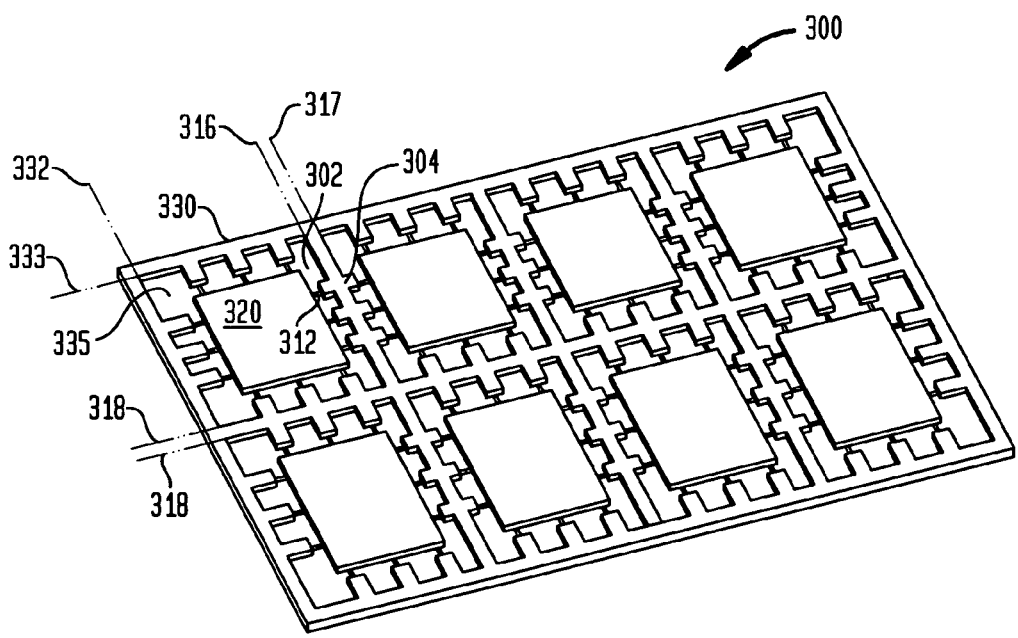
FIG. 10 is a diagrammatic top perspective view depicting a tape in another embodiment of the method.

In a method of according to yet another embodiment of the present invention, shown in FIG. 10, walls 330 are formed on top of the dielectric layer 310. The walls can be formed in the same manufacturing steps used to form the other metallic elements of the sheet, for example the terminal bodies 304 and the traces 312. An example of the steps of manufacturing such a tape were shown with reference to FIGS. 8a-f. The walls 330 desirably are made of the same material as the traces 312 and the terminals 304. In the variant shown in FIG. 10, the walls 330 are formed to surround each region 302 of the tape 300, so that the walls extend along the outer margins 332,333 of the tape, and also extend along the boundaries 316, 317, 318 and 319 between adjacent regions 302. The terminal bodies 304 are formed integrally with the walls 330. The walls 330 may serve as dams for holding the encapsulant during a dispensing or molding operation as discussed above. In a subsequent step, the walls 330 may be cut off from the tape 300. For example the walls 330 may be severed from the terminal bodies 304 by cutting along the lines 332, 333 and along the boundaries 316, 317, 318 and 319 shown in FIG. 10. This cutting can happen at the same time the individual units are severed from one another by cutting along the boundaries 316, 317, 318 and 319 between regions as described above. By cutting off the walls 330 the terminal bodies 304 are electrically disconnected from one another. The cutting step can performed by a saw as discussed above or by a punching device that punches out chip carrier by chip carrier individually, the punching device cutting tool having the cutting size of the desired size of a chip carrier or unit 302. The cutting size is preferably slightly smaller than the region formed by boundaries 333, 332, 316 and 318. In a preferred embodiment, the vertical height of the walls 330 is the same as the terminal bodies 304, but the vertical height of the walls 330 can exceed the height of the terminal bodies, and can also exceed the height of the device 320.

The walls 330 provide structural reinforcement to the tape. For example, the metallic walls help to assure that the tape changes dimensions in a uniform manner during heating or cooling. This facilitates alignment of the terminals with processing equipment. Moreover, in the embodiment where plural tapes are stacked upon one another prior to severance of the individual units from the tape, the walls facilitate alignment of the terminals on one tape with terminals on another tape. Tapes having walls can be formed using processes as discussed above; the walls can be formed from the same sheet of metal as the terminal bodies. Tapes with or without walls can be fabricated by other processes including, for example, additive plating processes. The walls can function as buses to provide electrical continuity with all regions of the tape during plating processes in manufacture of the tape.

In a further variant, walls similar to walls 330 are provided only around the edges of the tape, or only along boundaries 316, 317, 318 and 319 between regions 302. In yet another variant, walls are formed as separate elements from the terminal bodies 304. The walls are spaced apart from the terminal bodies and may be electrically isolated from the terminal bodies. Alternatively, the walls may be electrically connected to the terminal bodies by short traces which extend between the terminal bodies and the walls and which are removed when the units are severed from one another. Some or all of the walls may remain attached to the units after severance of the units from the tape.

Figure 11:
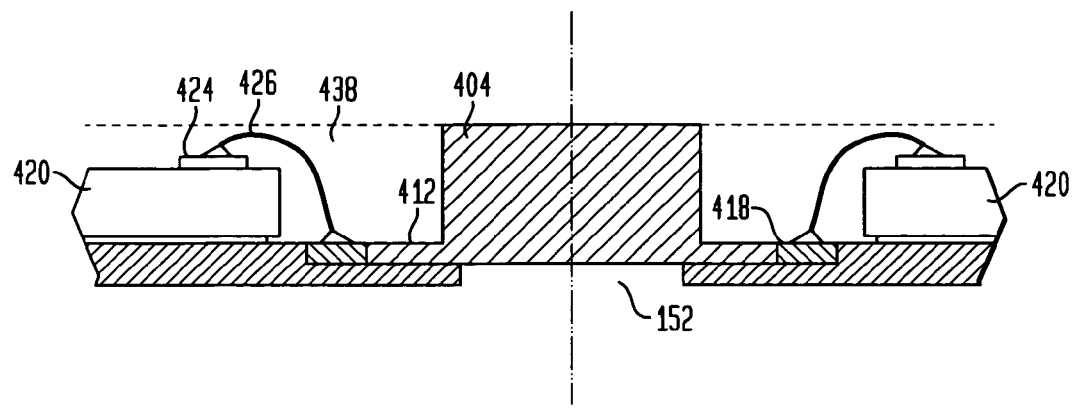
FIG. 11 is a sectional view depicting a wire-bonded electronic device in accordance with another embodiment of the present invention.

A further embodiment of the invention (FIG. 11) has a microelectronic unit 420 which is a wire-bonded device, instead of a flip-chip, bonded to the connection pads 418 of the traces 412 In this aspect of the invention, it is desirable that the vertical height of the terminal bodies 404 exceed the maximum vertical height of the device 420 and the device pads 424, and the maximal height of the bonding wires 426. The encapsulant 438 desirably covers the wire bonds 426.

Figure 12:
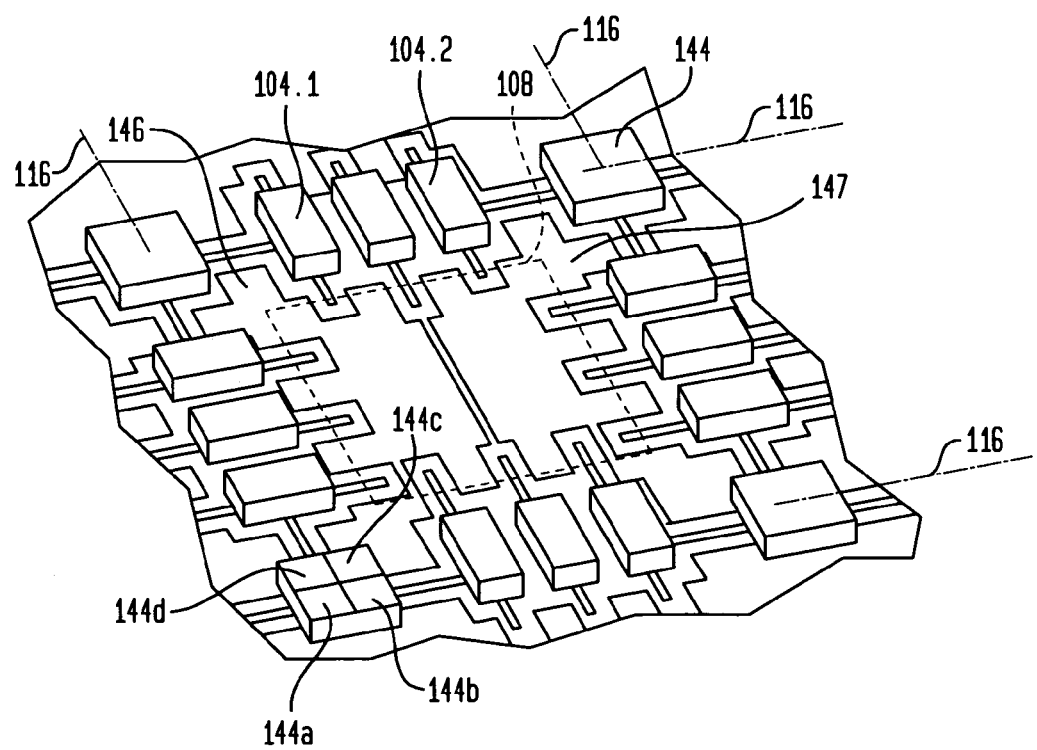
FIG. 12 is a diagrammatic top perspective view depicting the stacked chip carriers with a shielding layer according to another embodiment of the present invention.

In another embodiment of the present invention, as shown in a diagrammatic view in FIG. 12, support pillars 144 are formed onto the dielectric layer 110 in addition to the terminals 104 and the traces 112. In the stacked package of FIG. 9, where the chip carriers are stacked before being filled with an encapsulant, the corners of the chip carriers 102 are not supported against movement towards each other. The support pillars 144 on the various units 102 in a stack can be interconnected. Such arrangement can increase the connection strength of the stacked carriers 102, and can also reinforce the corners of the stacked package 200. In addition, it is possible to use the portions of the connection pillars, that face outwardly of the stacked package 200, to connect or install the device to an outside device, such as a wiring board or another device. For example, a heat sink could be soldered to the other surfaces of the stacked pillars, since metal usually provides good thermal conductivity.

In the step of manufacturing as depicted in FIG. 12, the support pillars 144 are arranged where the cutting lines 116 for cutting the chip carriers 102 from the tape 100 are crossing each other. Therefore, when the tape 100 is cut, the support pillars 144 will separate into four sections 144a, 144b, 144c, and 144d, arranged in the corners of the chip carrier 102'. The support pillars may have a circular shape as seen from above, however in the embodiment shown, the support pillars are square. In the structure of FIG. 12 the upper surface of the dielectric layer 110 is covered with shielding layers 146, 147. In this variant, the shielding layers 146, 147 form two separate layers, being electrically isolated from each other. The shielding layers 146, 147 substantially cover the entire surface of the dielectric layer 110 that is not covered by the traces 112, the terminals 104, and the support pillars 144. Only a small gap is arranged between the traces 112 and terminal bodies 104 and the shielding layers, to prevent short-circuiting of the terminals 112 and the traces 104. The width of the gap between the electrical elements 146, 147, 112, and 104 formed on the dielectric layer is most preferentially between 10-50 μm. In this embodiment, while the support islands 144 have substantially the same height as the terminal bodies 104, the shielding layers 146, 147 can have the same height as the traces 112. The shielding layers 146, 147 can be connected to one or more the support islands 144 or to one or more of the terminal bodies. For example, one shielding layer can be connected to ground by one or more ground terminal bodies 104.1, the other portion of the shielding layer can be connected to the power supply VCC for the microelectronic device, for example by one or more VCC terminal bodies 104.2. In such embodiment, the split shielding layer 146, 147 would provide an additional capacitive effect between the power supply and VCC lines. Use of support pillars 144a, 144b, 144c and 144d as ground or power connections can increase the cross-sectional area of the power supply lines GND, VCC for a microelectronic device mounted onto the chip carrier and can therefore improve the power supply stability, in addition to the mechanical reinforcement function of the support islands, when the chip carriers 102 are stacked to form a package.

Figure 13:
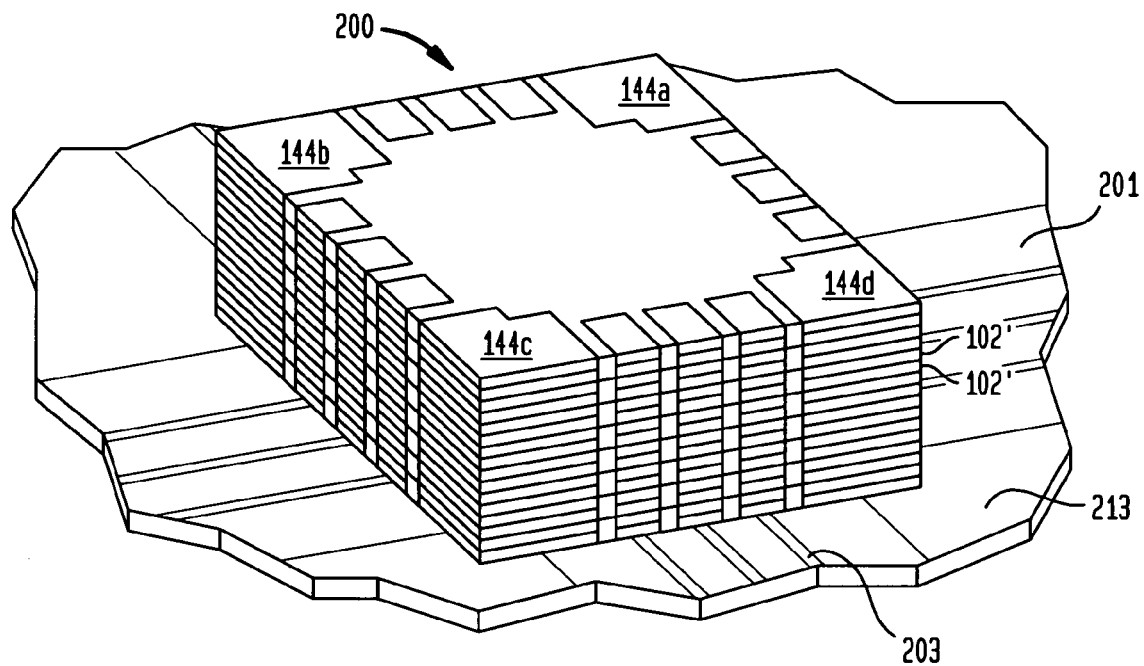
FIG. 13 is a diagrammatic top perspective view depicting a portion of a tape according to another embodiment of the present invention.

In FIG. 13 another embodiment of the stacked microelectronic package is depicted, based on the tape 100, shown in FIG. 12. When the chip carriers 102 are cut out and stacked together as shown in FIG. 13, the support islands 144 can be separated into four separate portions 144a, 144b, 144c, and 144d, that are arranged in respective corners of the chip carrier 102. The portions 144a, 144b, 144c and 144d can serve as reinforcement of the package corners, heat radiation elements, electrical connection or mechanical connection elements, or any combination of these features. Since the outer surfaces of the portions 144a, 144b, 144c and 144d are metallic, they can also be used as interconnection surfaces, for example by soldering. Once the chip carriers 102 are stacked to a stacked package 200, shielding layers 146, 147 can also prevent cross-talk between the individual chip carriers.

In addition, the shielding layers 146, 147 (FIG. 12) are also capable of transporting heat from the microelectronic device to the outside environment of a finished stacked device, as shown in FIG. 13. The microelectronic device thereby could not only be connected, for example by soldering, to the connection pads 118, 119 of the traces 112, but also to the shielding layers 146, 147 for example by soldering or by a thermal conduction paste. Since the shielding layers 146, 147 can be electrically connected to the support islands 144, the heat can be transferred to the support islands and evacuated to an outside environment by the outer surfaces of the support islands. In the stacked package as shown in FIG. 13, the heat would be evacuated trough the corners, where the portions 144a, 144b, 144c, and 144d of the support islands 144 are arranged. For example, the support islands 144 can be connected to a ground plane 213 on a wiring board, to which the stacked package 200 will be connected.

Figure 14:
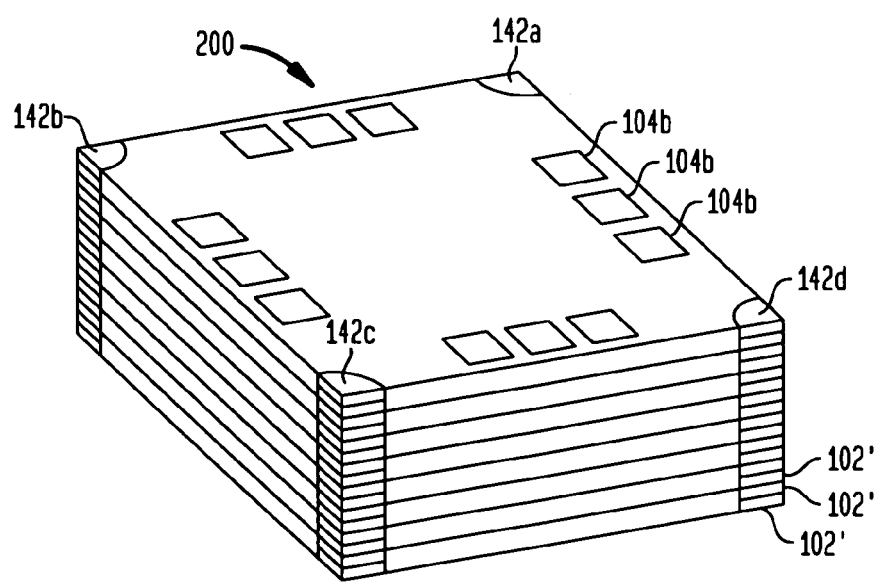
FIG. 14 is a diagrammatic top perspective view depicting stacked chip carriers according to another embodiment of the present invention.

In another embodiment of the present invention, as shown in a diagrammatic view of the FIG. 14, the terminals of adjacent chip carriers 102 are not formed as unitary terminal bodies during a previous manufacturing step, but as separate elements adjacent to the boundaries of the regions but spaced apart from the boundaries. Thus, when the regions are severed from the tape, the terminals will lie inboard of the edges of the individual units. In this embodiment, the terminal bodies do not have side surfaces exposed at the edges of the units as discussed above with reference to FIGS. 4-6. In this embodiment, support island segments 142a, 142b, 142c and 142d are also shown, and are arranged to form surfaces on the outer side surface of the package 200. The package. 200 has therefore metallic edges formed by the segments corner support elements 142a, 142b, 142c and 142d. As explained above, the segments 142a, 142b, 142c and 142d can be used for heat evacuation to connect a heat sink to the package 200, just like in the embodiment described with reference to FIG. 12 and the elements 144a, 144b, 144c, and 144d, but can also be used for interconnection with an external device such as a wiring board, or for electrical connection with the external device, for example by providing ground or the power supply voltage thereto.

It is also possible to arrange the segments 142a, 142b, 142c and 142d inside on the chip carrier 102 so that the segments 142a, 142b, 142c and 142d will also be located in-board. In the cutting step, where the chip carriers 102 are cut out of the sheet 100, there would be no common support islands 142 arranged on the tape 100, but already separate segments 142a, 142b, 142c and 142d, and the cutting lines would lead between adjacent segments.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package, comprising:
   (a) a dielectric layer having upper and lower surfaces;
   (b) a microelectronic element disposed above the upper surface of the dielectric layer;
   (c) an encapsulant overlying the upper surface of the dielectric layer, the encapsulant having a top surface remote from the dielectric layer and having a lower surface, the encapsulant also having edge surfaces; and
   (d) electrically conductive terminal bodies embedded in the encapsulant, the terminal bodies defining upper terminals exposed at the top surface of the encapsulant and lower terminals located recessed into the lower surface of the dielectric layer, the terminal bodies also being exposed at the edge surfaces of the encapsulant layer, at least some of the terminal bodies being electrically connected to the microelectronic element.

2. A package as claimed in claim 1 further comprising traces integral with the terminal bodies, the traces extending from the terminal bodies with an upper surface flush with the upper surface of the dielectric layer, the microelectronic element being electrically connected to the terminal bodies by the traces.

3. A package as claimed in claim 1 wherein the terminal bodies project upwardly from the upper surface of the dielectric layer by about 50-500 microns.

4. A package as claimed in claim 1 wherein the terminal bodies extend at least about 50 microns into the encapsulant from the edge surfaces of the encapsulant.

5. A package as claimed in claim 1, wherein the encapsulant covers the microelectronic element.

6. An assembly including a plurality of packages as claimed in claim 1 stacked on one another with the lower surface of the dielectric layer of each package other than a bottom one of the packages facing toward the top surface of the encapsulant in a subjacent one of the packages.

7. A microelectronic package, comprising:
   (a) a dielectric layer having upper and lower surfaces;
   (b) a microelectronic element disposed above the upper surface of the dielectric layer;
   (c) an encapsulant overlying the upper surface of the dielectric layer, the encapsulant having a top surface remote from the dielectric layer and having a lower surface, the encapsulant also having edge surfaces; and
   (d) electrically conductive terminal bodies embedded in the encapsulant, the terminal bodies defining upper terminals exposed at the top surface of the dielectric layer and lower terminals located recessed into the lower surface of the dielectric layer the terminal bodies also being exposed at the edge surfaces of the encapsulant layer, at least some of the terminal bodies being electrically connected to the microelectronic element,
   wherein the upper terminals have top surfaces flush with the top surface of the encapsulant.

8. A package as claimed in claim 7 wherein the dielectric layer has edges flush with the edge surfaces of the encapsulant.

9. A package as claimed in claim 8 wherein the terminal bodies extend through the dielectric layer and are exposed at the edges of the dielectric layer.

* * * * *